United States Patent [19]
Thimm

[11] Patent Number: 5,856,028
[45] Date of Patent: Jan. 5, 1999

[54] PROCESS FOR PRODUCING A METAL-COATED, METALLIZED COMPONENT OF ALUMINUM NITRIDE CERAMIC AND METAL-COATED COMPONENT OBTAINED THEREBY

[75] Inventor: Alfred Thimm, Wunsiedel, Germany

[73] Assignee: Hoechst CeramTec AG, Selb, Germany

[21] Appl. No.: 631,077

[22] Filed: Apr. 12, 1996

[30] Foreign Application Priority Data

Apr. 13, 1995 [DE] Germany ............... 195 14 018.4

[51] Int. Cl.$^6$ ............... C04B 41/88; H01L 23/36
[52] U.S. Cl. ............ 428/627; 428/216; 428/336; 428/432; 428/433; 428/697; 428/698; 428/701; 428/702; 428/630; 428/632; 428/633; 428/640; 428/643; 428/660; 428/665; 428/671; 428/672; 428/680
[58] Field of Search ............... 428/698, 457, 428/701, 702, 433, 216, 336, 432, 697, 699, 627, 630, 632, 633, 640, 660, 665, 671, 672, 680

[56] References Cited

U.S. PATENT DOCUMENTS

| | | | |
|---|---|---|---|
| 4,806,160 | 2/1989 | Hagiwara et al. | 106/1.12 |
| 4,840,853 | 6/1989 | Iio et al. | 428/698 |
| 5,045,400 | 9/1991 | Esashi | 428/698 |
| 5,063,121 | 11/1991 | Sato et al. | 428/698 |
| 5,138,426 | 8/1992 | Umeda et al. | 357/67 |
| 5,370,907 | 12/1994 | Yamakawa et al. | 427/376.3 |

FOREIGN PATENT DOCUMENTS

| | | |
|---|---|---|
| 0 047 071 | 3/1982 | European Pat. Off. . |
| 0 265 231 | 4/1988 | European Pat. Off. . |
| 0 276 788 | 8/1988 | European Pat. Off. . |
| 0 305 295 | 3/1989 | European Pat. Off. . |
| 0 384 950 | 9/1990 | European Pat. Off. . |
| 0 433 992 | 6/1991 | European Pat. Off. . |

OTHER PUBLICATIONS

Chemical Abstracts, vol. 116, No. 2, Jan. 13, 1992, Columbus, Ohio, US, Abstract No. 10382d, XP000317063.

Bronnes, "Die Herstellung geloeteter Keramik–Metallverbindungen mit Katodenzersstaeubung als Metallisierungstechnik", Philips techn., Research 35, pp. 227–229, 1975/76.

Cooper et al., "The Development of High Quality Alumina Substrates", Industrial Ceramics vol. 9, No. 3, pp. 115–119, 1989.

Fulrath et al., "Manganese Glass–Molybdenum Metallizing Ceramics", Ceramic Bulletin vol. 47, No. 5, pp. 493–497, 1968

Kageyama et al., "Mechanism of Reaction Between AlN and Glasses", IMC Proceedings, pp. 161–164, May 25–27, 1988.

Kubota et al., "Technological Progresses of a Thick Film Resistor for Aluminum Nitride Substrates with Devitrifiable Solder Glass", IMC 1988 Proceedings, pp. 137–141, May 25–27, 1988.

*Primary Examiner*—Archene Turner
*Attorney, Agent, or Firm*—Foley & Lardner

[57] ABSTRACT

A component of aluminum nitride metallized with a metallizing paste containing: (i) a pulverulent glass of the MnO—$Al_2O_3$—$SiO_2$ system as an adhesion promotor having a mean particle size of 2–15 µm; (ii) a refractory metal powder having a mean particle size of 1–4 µm; and (iii) an organic resin dissolved in a suitable solvent and/or a screen printing oil is disclosed. The metallizing paste preferably has a viscosity of 50–100 Pa·s when applied by screen printing, and a viscosity of <5 Pa·s when applied by dipping. The component of aluminum nitride metallized with the metallizing paste has at least one metal layer deposited on the metallizing paste, and the at least one metal layer applied has a bonding strength given by mean pull-off values of $\geq 3.5$ kN/cm$^2$.

20 Claims, No Drawings

PROCESS FOR PRODUCING A METAL-COATED, METALLIZED COMPONENT OF ALUMINUM NITRIDE CERAMIC AND METAL-COATED COMPONENT OBTAINED THEREBY

BACKGROUND

1. Field of the Invention

The present invention relates to a process for producing a metal-coated, metallized component of aluminum nitride ceramic, a metallizing paste for carrying out the process and also the metal-coated component obtained thereby.

2. Description of Related Art

In electronics it is prior art to metallize components of ceramic materials containing mostly aluminum oxide or aluminum nitride with high-melting metals and then to further reinforce these metallized components by application of further metal layers. Further components such as diodes, resistors and the like can then be applied to these uppermost metal layers by means of soft soldering, for example in the production of electronic circuits. High-melting metals (refractory metals) used are preferably tungsten and molybdenum. The uppermost metal layers can then be deposited on the metallized components, preferably by means of electrolytic processes.

In microelectronics, aluminum nitride components, especially substrates, are preferably used because of their highly thermally conductive properties. For this purpose, no $SiO_2$-containing glass phase is added as sintering aid to the aluminum nitride powder prior to firing, as is known in the production of aluminum oxide components. On the other hand, it is known in the prior art that a firmly adhering metallization with high-melting metals such as tungsten or molybdenum is only possible if certain amounts of $SiO_2$-containing glass phase (at least 1.5% by weight) are present in the fired ceramic (Bronnes, R. L., Die Herstellung gel öteter Keramik-Metallverbindungen mit Kathodenzerst äubung als Metallisierungstechnik, Philips Technische Rundschau 35, 227 (1975) and Cooper, D., The Development of High Quality Alumina Substrates, Industrial Ceramics 9, 115 (1989)). If the proportion of the glass phase is too low, it is also possible, as an alternative, to mix an addition of glass into the metallizing paste (Fulrath, R. M., Ceramic Bulletin 47, 493 (1968)). However, when using components of aluminum nitride ceramic it has to be noted that aluminum nitride is thermodynamically unstable toward many oxidic compounds, for example ZnO, PbO, $Bi_2O_3$, $B_2O_3$. Lowering of the free enthalpy is achieved by the formation of aluminum oxide, metal and nitrogen in a solid-state reaction. This reaction results in the destruction of the particle bonding in the ceramic, which lowers the strength (Kageyama, M., IMC Proceedings 1988, 161 (1988) and Kubota, T., IMC Proceedings 1988, 137 (1988)) . In contrast, silicon dioxide is inert toward aluminum nitride.

To increase the bonding strength between metallizing layer and the ceramic component, use has been made in the prior art of substances such as TiN, Ti, CaO, $Al_2O_3$, Si, $SiO_2$, Al, Ta, Cr, which form crystalline phases on the surface of the aluminum nitride and thus adhere well (EP 0 433 992 A1, EP 0 305 295 B1, EP 0 276 788 B1, U.S. Pat. No. 5,063,121 and U.S. Pat. No. 4,840,853). Such pulverulent additives are, however, very expensive, for example tantalum, titanium, titanium nitride, or the particle size of the powder can be set only with great difficulty, for example in the case of aluminum. The firing temperatures in the case of such additions are usually 1500°–1700° C. and are thus extraordinarily high.

SUMMARY OF THE INVENTION

It is therefore an object of the present invention to provide a process by means of which ceramic aluminum nitride components can be metallized relatively simply and economically, with the destruction of the micro-structure of the aluminum nitride component being avoided and a high bonding strength being able to be achieved.

The object is achieved according to the invention by a process for producing a metal-coated, metallized component of aluminum nitride ceramic in the steps:

preparation of a metallizing paste comprising a pulverulent glass of the $MnO$—$Al_2O_3$—$SiO_2$ system and a refractory metal powder, application of the metallizing paste to the component surface, firing the component coated with metallizing paste at a temperature >1100° C. under a reducing moist gas atmosphere of hydrogen-containing nitrogen, coating the metallized component with metal by means of metal plating, wherein, during the heating up of the ceramic component coated with metallizing paste, the atmosphere is humidified with water vapor so that the water vapor content in the temperature range between 800° C. and 1050° C. corresponds to a dew point of >295K and the water vapor content outside this temperature range corresponds to a dew point of <295K.

The object is further achieved according to the invention by a metallizing paste for carrying out the process as described above comprising a adhesion promotor of glass powder having a mean particle size of 2–15 μm, a refractory metal powder having a mean particle size of 1–4 μm and an organic resin dissolved in a suitable solvent or/and a screen printing oil, wherein the metallizing paste for application to the component by means of screen printing has a viscosity of 50–100 Pa·s and for application by dipping has a viscosity of <5 Pa·s.

Additionally the object is achieved according to the invention by a component of aluminum nitride metallized with the metallizing paste as described above having metal layers deposited thereon, wherein the metal layers applied have a bonding strength given by mean pull-off values of ≧3.5 $kN/cm^2$.

DETAILED DESCRIPTION OF PREFERRED EMBODIMENTS

The use of a glass-like adhesion promotor based on the system $MnO/Al_2O_3/SiO_2$ in addition to the metal power, in particular tungsten and/or molybdenum, for metallizing a ceramic component is known in principle from EP 0 265 231 B1. However, in that reference no ceramic components of aluminum nitride are metallized, owing to the known problem of glass-like adhesion promoters only insufficiently wetting the aluminum nitride component on melting on and forming bubbles (IMC Proceedings 1988, 137 (1988)). According to the invention, it has surprisingly been found that in the firing process of the metallizing paste the metallization layer deposited thereon then remains adhering firmly to the aluminum nitride component if a defined temperature profile in combination with a defined moisture content of the reducing protective gas according to the characterizing features as described above is adhered to during heating up.

The use of the manganese oxide-aluminum oxide-silicon dioxide system as adhesion promotor offers, in comparison with other glasses, for example those based on calcium silicate, the advantage that even at about 1400° C. they are sufficiently soft to spread out on the ceramic component without, however, being so fluid that they flow apart and broaden the printed pattern of the metallizing paste applied, for example, by means of screen printing. The composition of the glass-like adhesion promotor is preferably 30–50% by weight of MnO, 3–15% by weight of $Al_2O_3$, 30–60% by weight of $SiO_2$, with particular preference being given to adding a further amount of up to 2% by weight of $TiO_2$. However, the titanium dioxide is not essential for good adhesion, but rather the latter is attributable to the specific temperature profile. CaO, MgO, BaO, $Fe_2O_3$, $Na_2O$ can be present alone or in any combination with one another in a total amount of up to 4% by weight.

The corresponding metallizing paste is produced by milling commercial glass powder having a mean particle size of about 70 μm with water in a ball mill containing ceramic cylinders to a mean particle of 2–15 μm, preferably 7–9 μm. Then, 5–30% by weight of this dried glass powder, preferably 15% by weight, is mixed with 70–95% by weight, preferably 85% by weight, of a refractory metal powder, preferably tungsten and/or molybdenum powder; the metal powder should have a mean particle size of preferably 1–4 μm and should consist essentially or entirely of this metal. It is possible to use a metallizing paste whose weight ratio of glass powder to metal powder is from 1:19 to 6:14, in particular from 1:9 to 4:17.

An organic resin, for example a polyvinyl butyral or an acrylic resin, dissolved in a solvent, for example terpineol, or else a commercial screen printing oil (from Reusche), for example ethylcellulose dissolved in terpineol, is used to prepare a paste which should have a viscosity suitable for further processing. If the paste is applied to the component surface by means of screen printing, a viscosity of 50–100 Pa·s should be sought by addition of appropriate amounts of screen printing oil. If, in contrast, a geometrically complicated body of aluminum nitride ceramic is to be metallized, the body can be dipped into a paste having a viscosity of, for example, below 5 Pa·s. The quality of the printed pattern, obtained in the screen printing process can be influenced by the selection of the oils. An addition of from 0.1 to 5% of polyvinyl butyral (PVB) to a screen printing oil allows, for example, the printing of fine structures having a width of about 100 μm by reducing the flow of the paste and preventing a flowing apart of fine structures. The thickness of the metallizing paste layer applied can be from 10 to 50 μm, in particular from 20 to 25 μm.

The firing of the metallizing paste is carried out under a reducing, water vapor-containing protective gas, for example nitrogen.

Preference is given to using a mixture of 75% of nitrogen and 25% of hydrogen. Firing is carried out at temperatures of 1100°–1600° C., preferably at 1400° C.–1420° C. The hold time of the ceramic aluminum nitride component coated with metallizing paste is 30–120 minutes at the peak temperature, preferably 55–65 minutes. Aluminum nitride components for use in integrated circuits have usual thicknesses of 0.5–0.63 mm.

According to the invention, during heating up in the temperature range between 800° C. and 1050° C. sufficient water vapor is added to the protective gas atmosphere for the content of water vapor to correspond to a dew point >295K. This can be achieved by passing at least a part of the gases flowing into the furnace through warm water having a controllable temperature. In practice, the time for traversing this temperature interval should be between 50 and 150 min, preferably 100 min. However, the time has no influence on the bonding strength of the metallization. Below 800° C. and above 1050° C. the water vapor content of the gas mixture flowing into the furnace should correspond to a dew point <295K, preferably a dew point of 260–270K.

Studies by electron microscopy showed no damage to the microstructure of the aluminum nitride component after firing of the metallizing paste carried out in this way.

Subsequently, the metallized components are further coated using customary metal plating processes, for example electroless or cathodic. Preferably, a nickel layer is first deposited in a thickness of 1–5 μm, followed by a layer of gold in a thickness of about 0.1–1.5 μm. If the gold is cathodically deposited, the thickness of the layer can be even greater. In place of the gold, it is also possible to cathodically deposit a layer of lead-tin solder.

The process of the invention enables metal layers having high bonding strength to be applied relatively simply and inexpensively to aluminum nitride components. The metallizing paste used can equally well be used for aluminum oxide components. The components can be substrates to carry chips as well as any other kind of components, especially power modules, structural elements e.g. for power semiconductors, thyristors, resistive heating elements, cooling elements, heat exchangers.

The invention is illustrated by means of the following examples.

The bonding strength is determined by nickel-plated nuts having a copper core being soldered by means of a soft solder, for example using Sn63Pb37, under a reducing protective gas in a soldering furnace to both sides of a component coated with metal. A mold, for example of Al, can be used for fixing the arrangement. The nuts are then pulled off using a force measuring machine and the pull-off value is then the force per square centimeter which has to be applied to pull the metal layer off from the component.

EXAMPLE 1

A metallizing paste is applied in a thickness of 22 μm by means of screen printing to a fired substrate of aluminum nitride ceramic having a grain size of 4–8 μm and containing 3% by weight of yttrium oxide as sintering aid. The metallizing paste contained 68% by weight of tungsten powder, 13% by weight of a glass powder and 19% by weight of a screen printing oil. The glass was composed of 7.4% by weight of $Al_2O_3$, 36.3% by weight of MnO, 51.7% by weight of $SiO_2$, 0.9% by weight of $TiO_2$, the remainder being CaO, MgO, BaO, $Fe_2O_3$, $Na_2O$. The screen printing oil was ethylcellulose dissolved in terpineol. The particle size of the tungsten powder was 4 μm, the particle size of the glass powder was 8 μm. The metallizing paste had a viscosity of 80 Pa·s.

The metallization printed onto the ceramic substrate was fired in a protective gas atmosphere consisting of 25% of hydrogen and 75% of nitrogen at a temperature of 1450° C. for a period of 75 minutes, with the substrate lying on a molybdenum sheet. On heating up in the temperature range between 800° C. and 1050° C., a dew point of 308K was set. Outside this temperature range, the water vapor content of the atmosphere corresponded to a dew point of 265K.

After firing the metallizing paste, the metallized substrate was electroless nickel plated in a commercial nickel bath using hypophosphite as reducing agent and then gilded in a gold-exchange bath. The thickness of the nickel layer was 3.5 μm and the thickness of the gold layer was 0.2 μm.

The pull-off value determined by the above method was 3.8 kN/cm$^2$. Such metallized substrates are used, in particular, in the high-volume production of electronic components which can be soldered by means of a soft solder to the metal-coated, metallized substrate.

EXAMPLE 2

In an alteration to the process described in Example 1, an alloy layer of lead-tin, preferably Sn63Pb37, having a thickness of 15 μm was cathodically deposited in an electroplating drum after nickel plating. The pull-off value determined was the same as in Example 1. Such metallized substrates provided with a layer of soft solder can have components assembled thereon in low-volume production without employing a soldering station by heating to at least 183° C.

EXAMPLE 3

A metallizing paste was applied to a fired substrate of aluminum nitride containing 5% by weight of aluminum oxide and 3% by weight of yttrium oxide as sintering aid. This substrate comprises discrete particles of aluminum oxide in a matrix of aluminum nitride. The composition of the metallizing paste and the processing parameters were as in Example 1. The aluminum oxide grains had a size of 2 μm. The pull-off value determined was 3.9 kN/cm$^2$.

Since in the case of such substrates the thermal conductivity can be reduced as a function of the aluminum oxide content of the substrate by 50–80% in comparison with ceramics of pure aluminum nitride, such substrates can be used for generating defined temperatures on the substrate surface.

EXAMPLE 4

In an alteration to Example 1, a metallizing paste containing a glass of the composition 39.2% by weight of MnO, 1.8% by weight of Al$_2$O$_3$, 47.1% by weight of SiO$_2$, 2% by weight of CaO, 0.3% by weight of TiO$_2$, remainder alkali metal oxides, alkaline earth metal oxides, iron oxide each at <1% by weight, was applied to an aluminum nitride ceramic substrate in a thickness of 25 μm and fired using the same process parameters as in Example 1. Nickel and gold layers were subsequently deposited thereon as described in Example 1. The pull-off value determined was 3.8 kN/m$^2$.

I claim:

1. A component of aluminum nitride metallized with a metallizing paste comprising: (i) a pulverulent glass of the MnO—Al$_2$O$_3$—SiO$_2$ system as an adhesion promoter having a mean particle size of 2–15 μm; (ii) a refractory metal powder having a mean particle size of 1–4 μm; and (iii) an organic resin dissolved in a suitable solvent and/or a screen printing oil, the metallizing paste having a viscosity of 50–100 Pa·s when applied by means of screen printing, and a viscosity of <5 Pa·s when applied by dipping, whereby the component of aluminum nitride metallized with the metallizing paste has at least one metal layer deposited on the metallizing paste, wherein the at least one metal layer applied has a bonding strength given by mean pull-off values of ≧3.5 kN/cm$^2$.

2. A metallized component of aluminum nitride having metal layers deposited thereon as claimed in claim 1, wherein the metal layers applied comprise a nickel layer and a gold layer and have pull-off values in the range 3.8±0.6 kN/cm$^2$.

3. A metallized component of aluminum nitride having metal layers deposited thereon as claimed in claim 1, wherein the metal layers comprise a nickel layer and an alloy layer of Sn63Pb37 and have pull-off values in the range 3.8±0.6 N/cm$^2$.

4. The component as claimed in claim 1 wherein the pulverulent glass powder has a mean particle size of from 7 to 9 μm.

5. The component as claimed in claim 1, wherein the weight ratio of pulverulent glass powder to refractory metal powder is within the range of from 1:9 to 4:17.

6. The component as claimed in claim 1, wherein the metallizing paste is applied having a thickness within the range of from 20 to 25 μm.

7. The component as claimed in claim 1, wherein the at least one metal layer is galvanically deposited on the metallizing paste and comprises a nickel layer having a thickness of from 1 to 5 μm, and has a separation value of 3.8±0.6 kN/cm$^2$.

8. The component as claimed in claim 2, further comprising an additional layer on said nickel layer wherein the additional layer comprises gold or a lead-tin solder and has a thickness of from 0.1 to 1.5 μm.

9. The component as claimed in claim 8, wherein the lead-tin solder comprises Sn63Pb37.

10. A component of aluminum nitride that is metallized by means of a fired metallizing paste and then galvanically coated with at least one metal layer, the metallizing paste comprises: (i) a pulverulent glass of the MnO—Al$_2$O$_3$—SiO$_2$ system as an adhesion promoter; (ii) a refractory metal powder; and (iii) an organic resin dissolved in a suitable solvent and/or screen print oil, whereby the weight ratio of the pulverulent glass powder to the metal powder is within the range of from 1:19 to 6:14, and wherein the metallizing paste has a viscosity of 50–100 Pa·s when applied by means of screen printing, and a viscosity of <5 Pa·s when applied by dipping, whereby the component of aluminum nitride metallized with the metallizing paste has metal layers deposited on the metallizing paste, wherein the metal layers applied have a bonding strength given by mean pull-off values of ≧3.5 kN/cm$^2$, wherein the metallizing paste is applied to the aluminum nitride ceramic and fired at a temperature between 1100° C. and 1600° C. for a period of time of 30 to 120 minutes in a reducing moist gas atmosphere of aqueous nitrogen, whereby the water vapor content of the atmosphere is set to a dewpoint of >295K within the heating up temperature range of from 800° C. to 1050° C., and the atmosphere is set to a dewpoint of <295K at temperatures below 800° C. and above 1050° C.

11. The component as claimed in claim 10, wherein the pulverulent glass powder is comprised of from 30 to 50 weight percent of MnO, from 30 to 60 weight percent of SiO$_2$, from 3 to 15 weight percent of Al$_2$O$_3$ and from 0 to 2 weight percent of TiO$_2$O.

12. The component as claimed in claim 10, wherein the pulverulent glass powder has a mean particle size of from 2 to 15 μm.

13. The component as claimed in claim 10, wherein the refractory metal powder is selected from the group consisting of tungsten, molybdenum, and mixtures thereof, and wherein the refractory metal powder has a mean particle size of from 1 to 4 μm.

14. The component as claimed in claim 10, wherein the weight ratio of pulverulent glass powder to refractory metal powder is within the range of from 1:9 to 4:17.

15. The component as claimed in claim 10, wherein the metallizing paste is applied having a thickness within the range of from 20 to 25 μm.

16. The component as claimed in claim 10, wherein the metallizing paste is fired at a temperature of from 1400° C. to 1420° C.

17. The component as claimed in claim 16, wherein the metallizing paste is fired for a period of from 55 to 65 minutes.

18. The component as claimed in claim 10, wherein the at least one metal layer is galvanically deposited on the metallizing paste and comprises a nickel layer having a thickness of from 1 to 5 µm, and has a separation value of 3.8±0.6 kN/cm$^2$.

19. The component as claimed in claim 18, further comprising an additional layer on said nickel layer wherein the additional layer comprises gold or a lead-tin solder and has a thickness of from 0.1 to 1.5 µm.

20. The component as claimed in claim 19, wherein the lead-tin solder comprises Sn63Pb37.

\* \* \* \* \*